(12) United States Patent
Takemura et al.

(10) Patent No.: US 7,731,801 B2
(45) Date of Patent: Jun. 8, 2010

(54) SEMICONDUCTOR WAFER TREATMENT METHOD AND APPARATUS THEREFOR

(75) Inventors: Makoto Takemura, Imari (JP); Yasuo Fukuda, Saga (JP); Kazuaki Souda, Kashima (JP); Junichiro Iwahashi, Imari (JP); Koichi Okuda, Imari (JP)

(73) Assignee: Sumco Corporation, Tokyo (JP)

( * ) Notice: Subject to any disclaimer, the term of this patent is extended or adjusted under 35 U.S.C. 154(b) by 1171 days.

(21) Appl. No.: 11/213,809

(22) Filed: Aug. 30, 2005

(65) Prior Publication Data

US 2006/0042654 A1    Mar. 2, 2006

(30) Foreign Application Priority Data

Sep. 1, 2004    (JP) .............................. 2004-254561

(51) Int. Cl.
*B08B 6/00*    (2006.01)
*C25F 1/00*    (2006.01)
*C25F 3/30*    (2006.01)

(52) U.S. Cl. .......................... 134/1.3; 438/745; 438/749

(58) Field of Classification Search ........................ None
See application file for complete search history.

(56) References Cited

U.S. PATENT DOCUMENTS

| | | | |
|---|---|---|---|
| 5,447,640 A | * | 9/1995 | Omi et al. ................... 210/748 |
| 5,896,875 A | * | 4/1999 | Yoneda ..................... 134/102.3 |
| 5,954,885 A | * | 9/1999 | Ohmi ......................... 134/1.3 |
| 6,406,551 B1 | * | 6/2002 | Nelson et al. .................. 134/3 |
| 6,464,867 B1 | * | 10/2002 | Morita et al. ................ 210/202 |

FOREIGN PATENT DOCUMENTS

JP    2004-079649    3/2004

* cited by examiner

*Primary Examiner*—Duy-Vu N Deo
(74) *Attorney, Agent, or Firm*—Pillsbury Winthrop Shaw Pittman, LLP

(57) ABSTRACT

In the ozone water treatment process, the silicon wafer is treated with the first ultra-pure water that includes ozone. The first ultra-pure water is refined by the ultraviolet ray sterilization method. The first ultra-pure water includes total organic carbon content of more than 1 μg/liter and not more than 20 μg/liter, so that the silicon wafer of the predetermined degree of cleanliness is obtained. The silicon wafer is treated by using the second ultra-pure water that has a lower TOC value than the first ultra-pure water in the ultra-pure water rinsing process (including the chemical solution cleaning process as required). The second ultra-pure water is refined by the ultraviolet ray oxidization method, and includes total organic carbon content with a concentration of 1 μg/liter or less. Thus the silicon wafer of the predetermined degree of cleanliness is obtained.

8 Claims, 2 Drawing Sheets

SEMICONDUCTOR WAFER TREATMENT METHOD AND APPARATUS THEREFOR

BACKGROUND OF THE INVENTION

1. Field of the Invention

The present invention relates to a method and an apparatus for treating a semiconductor wafer and, more particularly, to a semiconductor wafer cleaning technology that involves an ozone water cleaning process and an ultra-pure water rinsing process.

2. Description of Related Art

In recent years, much attention has been attracted to ozone water made by including ozone gas in ultra-pure water that is used as cleaning water in processes of manufacturing semiconductor wafer and semiconductor chips. Ultra-pure water refers to water having such a level of purity as the content of materials dissolved therein such as sodium, iron, copper and zinc is in a range of one billionth grams per litter (μg/liter) to one trillionth grams (ng/liter). Ozone water produces oxygen trough spontaneous decomposition in a strong oxidation reaction. As a result, use of ozone water to clean the semiconductor wafer makes it easier to process the waste water. Ozone water is made by mixing ozone gas into ultra-pure water.

As the sizes of devices formed on semiconductor chips become increasingly smaller, the semiconductor wafer is required to have higher degree of cleanliness.

Thus the ozone water is made from ultra-pure water of ever higher degree of purity. Such an ultra-pure water includes extremely reduced concentrations of total organic carbon content (TOC) as well as particulate matter and metallic impurities.

The total organic carbon content can be decreased by irradiating the ultra-pure water with ultraviolet ray.

Concentration of ozone gas in ultra-pure water decreases over time through diffusion into the atmosphere and spontaneous decomposition, in addition to being consumed through reaction of the ozone. Rate of decrease in ozone concentration with time may be represented by half life of ozone, that is the period of time over which the concentration of ozone dissolved in ultra-pure water decreases to one half of the original level. Half life of ozone in ultra-pure water is typically from 10 to 30 minutes, while it depends on the liquid surface area (area of gas-liquid interface). In case the ultra-pure water is contained in a container having a large opening such as cleaning bath, half life of ozone becomes about 2 to 5 minutes.

The applicant of the present patent application previously proposed a method of elongating the half life of ozone by adding a trace of organic solvent to ultra-pure water thereby to suppress the spontaneous decomposition of ozone, as described in Japanese Unexamined Patent Application, First Publication No. 2004-079649.

The method described in Japanese Unexamined Patent Application, First Publication No. 2004-4079649 makes it possible to manufacture ozone water having a longer half life of ozone.

The ultra-pure water used to make this ozone water includes particulate matter and metallic impurities in addition to the carbon compounds. Contents of these impurities are higher than in ultra-pure water that does not include ozone gas.

Methods of refining ultra-pure water known in the art include ultraviolet ray sterilization method and ultraviolet ray oxidization method. The ultraviolet ray sterilization method exterminates harmful bacteria included in the raw water by irradiating the water with ultraviolet ray. The ultraviolet ray oxidization method decomposes nitrogen and phosphorus included in the raw water by means of the energy of ultraviolet ray by irradiating the water with ultraviolet ray.

When ultra-pure water treated by the ultraviolet ray sterilization method is used in the chemical solution cleaning process or the ultra-pure water rinsing process to treat the semiconductor wafer, it was found that the degree of cleanliness of the semiconductor wafer is lower than that achieved by using ultra-pure water treated by the ultraviolet ray oxidization method.

The ultra-pure water refined by the ultraviolet ray oxidization method has higher degree of cleanliness than that of the ultra-pure water treated by the ultraviolet ray sterilization method.

Therefore, a higher degree of cleanliness of the semiconductor wafer can be achieved by using the ultra-pure water treated by the ultraviolet my oxidization method in the chemical solution cleaning process and ultra-pure water rinsing process for the treatment of the semiconductor wafer.

However, it is difficult to use the ultra-pure water treated by the ultraviolet ray oxidization method in all cleaning and rinsing processes including the ozone water treatment process, due to the problem of half life of ozone.

It is necessary to make ozone water that includes high concentration of ozone, in order to overcome the problem of half life of ozone in the ozone water cleaning process that uses ozone water made by the ultraviolet my oxidization method.

However, an exclusive manufacturing facility is required to manufacture the ozone water that includes high concentration of ozone, leading to another problem of increasing manufacturing cost.

The inventor of the present application completed the present invention upon the following finding. That is, a semiconductor wafer having a high degree of cleanliness can be obtained at a low cost by using ultra-pure water that has been treated by the ultraviolet ray sterilization method and has a somewhat high TOC value in the ozone water treatment process, using ultra-pure water that has been treated by the ultraviolet ray oxidization method and has a low TOC value in the chemical solution cleaning process where the ultra-pure water of high purity is used as the water to dilute a chemical solution and in the ultra-pure water rinsing process that requires a high degree of cleanliness.

SUMMARY OF THE INVENTION

An object of the present invention is to provide a method and an apparatus for treating semiconductor wafers that can achieve a high degree of cleanliness of the semiconductor wafers.

Another object of the present invention is to provide a method and an apparatus for treating the semiconductor wafers that allow it to treat the semiconductor wafers at a low equipment cost by utilizing existing facilities.

Other objects and advantages of the present invention will become apparent from the following detailed description.

The present invention provides a semiconductor wafer treatment method including an ozone water treatment process and an ultra-pure water rinsing process applied after the ozone water treatment process, wherein the semiconductor wafer is treated to achieve a predetermined degree of cleanliness in the ozone water treatment process by using a first ultra-pure water that includes a predetermined total organic carbon content and includes ozone gas added thereto, and then the semiconductor wafer is treated to achieve a higher degree of cleanliness than the degree of cleanliness described above in the ultra-pure water rinsing process by using a second ultra-pure water that includes less total organic carbon content than the first ultra-pure water.

The semiconductor wafer treatment method of the present invention can be applied to a wafer manufacturing line where the semiconductor wafer is manufactured. The semiconductor wafer treatment method can also be applied to a device manufacturing line where integrated circuits are formed on the semiconductor wafer.

The method of the present invention can be applied to a semiconductor wafer made of silicon or gallium arsenic, or an SOI wafer including a supporting wafer and an active layer with an insulation film interposed therebetween. The method may also be applied to a semiconductor wafer whereon integrated circuits such as memory circuit, microprocessor circuit or gate array circuits are formed.

The ozone water treatment process is employed in any cleaning processes conducted after slicing a semiconductor ingot into semiconductor wafers to just before shipping. It may also be employed in any cleaning processes conducted after processing the wafer in the device manufacturing process. The ozone water treatment process has such a wide range of applications, because the ozone water has high power of oxidization, and can be used not only in the removal of particulate matter deposited on the semiconductor wafer, but also in the removal of organic and metallic impurities and in the formation of oxide film.

The ultra-pure water rinsing process includes a process of cleaning the semiconductor wafer after a chemical solution has been used thereon, and a process of rinsing the semiconductor wafer that has been polished for final cleaning. The chemical solution may be SC-1 solution, SC-2 solution or aqueous solution of hydrofluoric acid. The chemical solution may be prepared from either the first ultra-pure water or the second ultra-pure water. When the ultra-pure water used in chemical cleaning is required to have a high degree of cleanliness, it is preferable to use the second ultra-pure water.

According to the semiconductor wafer treatment method, for example, the semiconductor wafer may also be cleaned by immersing it in a cleaning bat filled with the first ultra-pure water or the second ultra-pure water. Alternatively, the semiconductor wafer may be rotated while spraying the first ultra-pure water or the second ultra-pure water onto the surface thereof, as in the spin cleaning method that uses a spin cleaning apparatus.

According to the semiconductor wafer treatment method of the present invention, the semiconductor wafer is treated by using the first ultra-pure water that includes ozone gas in the ozone water treatment process. The first ultra-pure water is refined by the ultraviolet ray sterilization method. For this purpose, the first ultra-pure water includes the total organic carbon content with TOC value higher than 1 µg/liter and not higher than 20 µg/liter. The semiconductor wafer is treated with the first ultra-pure water with ozone included therein. Ozone included in the first ultra-pure water acts as a clean and powerful oxidizing agent. As a result, residual organic matter such as surface activating agent deposited on the semiconductor wafer is decomposed and removed, and a smooth oxide film having a uniform thickness can be formed on the semiconductor wafer.

In the ultra-pure water rinsing process, the semiconductor wafer is treated by using the second ultra-pure water that has a TOC value lower than that of the first ultra-pure water. The second ultra-pure water is refined by the ultraviolet ray oxidization method, and has a TOC value of 1 µg/liter or less.

Through the processes described above, the semiconductor wafer is cleaned to a predetermined degree of cleanliness in the ozone water treatment process, and is finally treated with the second ultra-pure water of higher degree of cleanliness in the ultra-pure water rinsing process. This enables it to obtain the semiconductor wafer that has a high degree of cleanliness.

According to the semiconductor wafer treatment method of the present invention, the first ultra-pure water may be treated by the ultraviolet ray sterilization method and the second ultra-pure water may be treated by the ultraviolet ray oxidization method.

Ozone gas used to make the ozone water can be made from oxygen gas by silent discharge method. Electrolysis may also be employed to produce ozone gas by decomposing water.

In this case, the first ultra-pure water that includes the ozone water is refined by treating the raw water by the ultraviolet ray sterilization method. This results in the total organic carbon content with TOC value higher than 1 µg/liter and not higher than 20 µg/liter.

The second ultra-pure water is refined by applying the ultraviolet ray oxidization method to the first ultra-pure water or ordinary water. TOC value of the second ultra-pure water is reduced to 1 µg/liter or less. However, since the carbon content is very small, ozone can very easily decay when included in the second ultra-pure water.

According to the semiconductor wafer treatment method of the present invention, the total organic carbon content in the first ultra-pure water is more than 1 µg/liter and not more than 20 µg/liter, and the total organic carbon content in the second ultra-pure water may be 1 µg/liter or less.

In this case, TOC value of the first ultra-pure water is higher than 1 µg/liter and not higher than 20 µg/liter. When the TOC value is within this range, ozone is less likely to decay even when ozone gas is included in the first ultra-pure water. It is also made possible to achieve such a degree of cleanliness that can remove particulate matter from the semiconductor wafer.

TOC value in the second ultra-pure water is 1 µg/liter or less. Thus the second ultra-pure water has lower TOC value and higher degree of cleanliness than the first ultra-pure water. Therefore, the semiconductor wafer of higher degree of cleanliness can be obtained by treating the semiconductor wafer with the second ultra-pure water.

According to the semiconductor wafer treatment method of the present invention, the chemical solution cleaning process may be applied where the semiconductor wafer is cleaned with a chemical solution prepared by using the second ultra-pure water as the diluting water, before the ultra-pure water rinsing process.

The chemical solution may be, for example, SC-1 solution, SC-2 solution or aqueous solution of hydrofluoric acid. The chemical solution may be diluted by the second ultra-pure water to any concentration.

The chemical solution cleaning process may be applied either before or after the ozone water treatment process.

The present invention provides a semiconductor wafer treatment apparatus for treating a semiconductor wafer to a predetermined degree of cleanliness, including an ozone water treatment unit where the semiconductor wafer is treated using the first ultra-pure water that includes a predetermined total organic carbon content and includes ozone gas added thereto, and an ultra-pure water rinsing treatment unit where the semiconductor wafer is treated to achieve a higher degree of cleanliness than the degree of cleanliness described above using the second ultra-pure water that has a higher degree of cleanliness than that of the first ultra-pure water.

In the semiconductor wafer treatment apparatus according to the present invention, the first ultra-pure water may be treated by the ultraviolet my sterilization method and the second ultra-pure water may be treated by the ultraviolet ray oxidization method.

In the semiconductor wafer treatment apparatus of the present invention, the total organic carbon content in the first ultra-pure water is more than 1 µg/liter and not more than 20 µg/liter, and the total organic carbon content in the second ultra-pure water may be 1 µg/liter or less.

In the semiconductor wafer treatment apparatus of the present invention, a chemical solution cleaning unit may be provided where the second ultra-pure water is used to dilute the chemical solution and the semiconductor wafers are cleaned with the chemical solution.

According to the present invention, the first ultra-pure water that suppresses the decay of ozone is used in the ozone water treatment process, and the second ultra-pure water is used in other cleaning processes except for the ozone water treatment process or in the ultra-pure water rinsing process (including the chemical solution cleaning process as required). This causes the semiconductor wafer to be treated to the predetermined degree of cleanliness in the ozone water treatment process, and eventually be treated by the second ultra-pure water having higher degree of cleanliness. Accordingly, the semiconductor wafer of a higher degree of cleanliness is obtained.

The second ultra-pure water can be easily obtained from the first ultra-pure water in an existing ultraviolet oxidization treatment apparatus by simply installing an additional piping thereto. Therefore, it is not necessary to install a special facility to refine the first ultra-pure water and the second ultra-pure water.

DETAILED DESCRIPTION OF THE INVENTION

Example 1

Examples of the present invention will now be described with reference to the accompanying drawings.

First, the method of refining the first ultra-pure water used to treat a silicon wafer (the semiconductor wafer) will be described.

Figure 1:
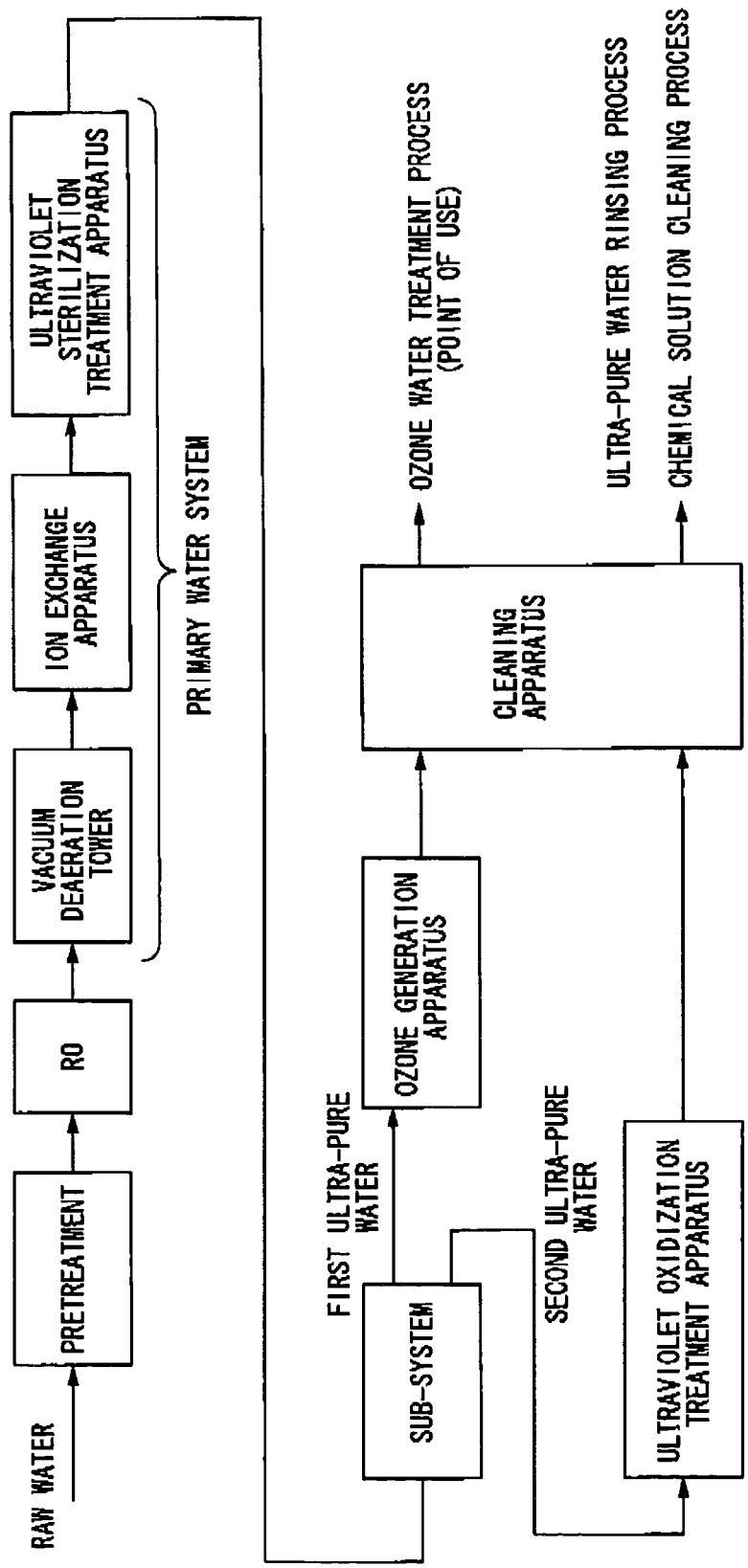
FIG. 1 is a flow chart of a process of refining first ultra-pure water and second ultra-pure water from raw water in the semiconductor wafer treatment method according to Example 1 of the present invention.

As shown in a flow chart of FIG. 1, the first ultra-pure water is made by refining the raw water in an ultra-pure water refining system including a pretreatment, a primary water system, a sub-system and the like that are applied successively. Specifically, after preparing the raw water, the pretreatment is carried out to remove turbidity, colloidal matter and the like from the raw water by means of a sedimentation tank and a filter.

Then residual impurities such as ions and fine particles are removed from the pretreated raw water by means of RO (reverse osmosis) apparatus that is the primary water system. Then dissolved oxygen is removed from the raw water by means of a vacuum deaeration tower. Further, ions remaining in the raw water are removed by using an ion exchange resin. Bacteria residing in the water are removed by means of an ultraviolet sterilization treatment apparatus. This results in a low total organic carbon content in the first ultra-pure water with TOC value higher than 1 µg/liter and not higher than 20 µg/liter. Last, trace impurities are removed from the raw water by the subsystem, and the first ultra-pure water that has been refined is supplied to the ozone generation apparatus.

Then in the ozone generation apparatus, ozone gas is included in the first ultra-pure water so as to make the ozone water. For the ozone generation apparatus, for example, an ozone generation apparatus of electrolysis type may be used. Alternatively, an ozone generation apparatus of silent discharge type may also be used.

The ozone water that has been made is supplied through a piping to a cleaning apparatus where it is used. The ozone water includes carbon compound, although in an extremely small quantity, that suppresses ozone from decaying spontaneously. As a result, ozone concentration does not decrease much and it is made possible to effectively treat the silicon wafer by using the ozone water.

Now the method of refining the second ultra-pure water used to treat a silicon wafer will be described.

The second ultra-pure water is made by refining the first ultra-pure water. As shown in the flow chart of FIG. 1, the first ultra-pure water is supplied through the piping to the ultraviolet oxidization treatment apparatus. Nitrogen and phosphorus included in the first ultra-pure water are removed in the ultraviolet oxidization treatment apparatus, thereby to provide the second ultra-pure water. The second ultra-pure water has TOC value reduced to 1 µg/liter or less.

This refining method enables it to make the second ultra-pure water by refining the first ultra-pure water using the existing ultraviolet oxidization treatment apparatus as it is. The second ultra-pure water may also be made directly from raw water.

The first ultra-pure water including ozone added thereto and the second ultra-pure water are then supplied to a wafer treatment apparatus (cleaning apparatus), where the silicon wafer is treated using either the first ultra-pure water or the second ultra-pure water. While the cleaning apparatus is supplied with the first ultra-pure water that includes ozone or the second ultra-pure water, it may also be supplied with the first ultra-pure water and the second ultra-pure water at the same time.

The wafer treatment apparatus is for treating the silicon wafer by immersing it in a cleaning bath filled with the first ultra-pure water or the second ultra-pure water. Or, alternatively, the silicon wafer may be rotated while spraying the first ultra-pure water that includes ozone or the second ultra-pure water onto the surface thereof, as in the spin cleaning method that uses a spin cleaning apparatus.

In the ozone water treatment process, the silicon wafer is treated by using the first ultra-pure water that includes ozone gas. Ozone water treatment is applied to every cleaning operation carried out between the silicon wafer processing operations. In these operations, ozone included in the first ultra-pure water acts as a clean and powerful oxidizing agent. As a result, residual organic matter such as surface activating agent deposited on the silicon wafer is decomposed and removed, and a smooth oxide film having a uniform thickness can be formed.

In the cleaning process after a chemical solution has been used and in the ultra-pure water rinsing process, the silicon wafer is treated by using the second ultra-pure water. The chemical solution is prepared by using the second ultra-pure water. The second ultra-pure water has a higher degree of purity than the first ultra-pure water. The second ultra-pure water is used to clean the silicon wafer that has been subjected to chemical treatment using hydrofluoric acid or the like, and in the ultra-pure water rinsing process for the final cleaning of the silicon wafer. Thus the silicon wafer can be treated to a higher degree of cleanliness.

Figure 2:
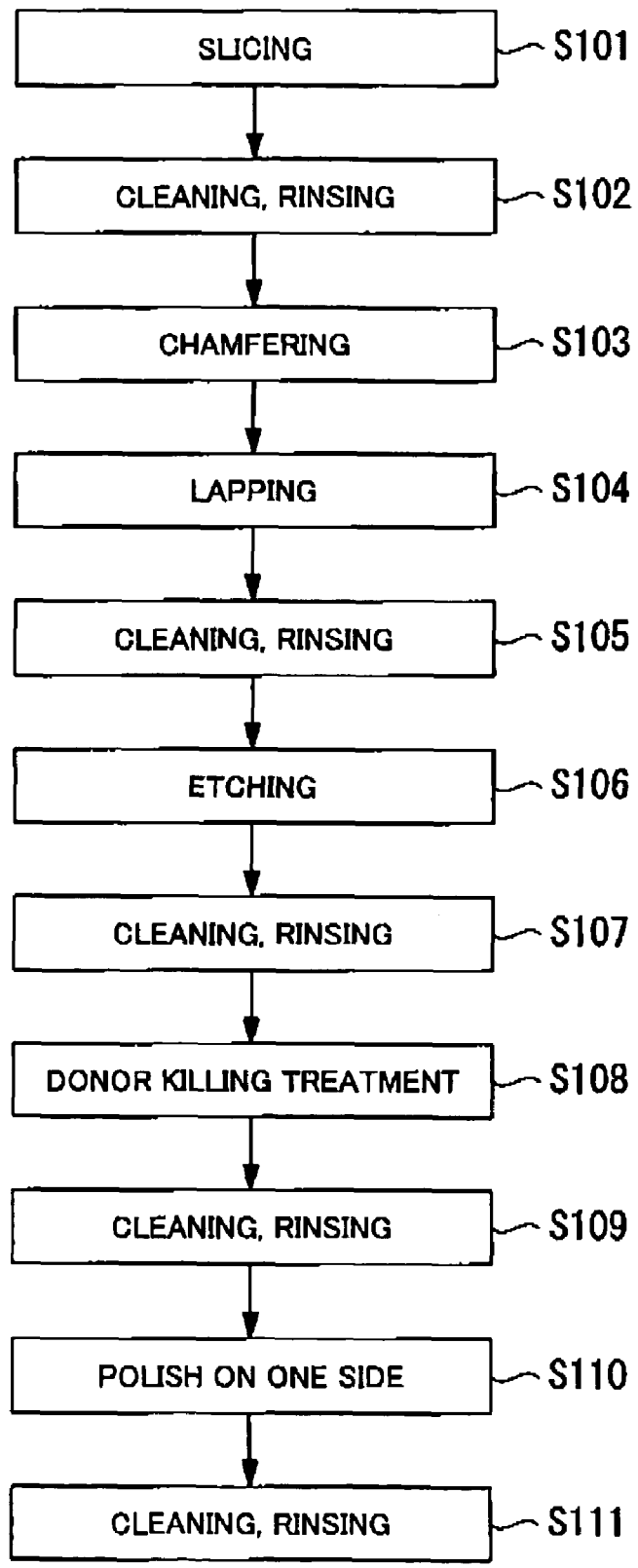
FIG. 2 is a flow chart of a process of manufacturing the semiconductor wafer where the semiconductor wafer treatment method according to Example 1 of the present invention is applied.

Now the method of manufacturing the silicon wafer where the semiconductor wafer treatment method of Example 1 is applied will be described by making reference to the flow chart of FIG. 2.

As shown in the flow chart of FIG. 2, the silicon wafer manufacturing process includes steps of slicing, chamfering, lapping, donor killing and polishing that are applied sequentially, while the ozone water treatment process, the chemical solution cleaning process and the ultra-pure water rinsing process (hereinafter referred to as cleaning and rinsing processes) are applied between these steps.

First, a single crystal ingot of silicon is sliced into a number of silicon wafers (S101). The silicon wafers are cleaned and rinsed (S102). Specifically, the sliced silicon wafers are first cleaned with the first ultra-pure water. The silicon wafers cleaned with the first ultra-pure water are then cleaned with a chemical solution selected from among the group of SC-1 solution, SC-2 solution, aqueous solution of hydrofluoric acid and the like. The silicon wafers cleaned with the chemical solution are then rinsed with the second ultra-pure water, thereby to remove particulate matter deposited during the slicing process.

The silicon wafers are then chamfered (S103) and lapped (S104) successively. The lapped silicon wafers are subjected to the cleaning and rinsing processes using the first ultra-pure water and the second ultra-pure water (S105). Then in order to relieve strains caused by slicing, the silicon wafers are etched with a predetermined etching solution (S106). The etching solution is rinsed off the silicon wafer in the cleaning and rinsing processes (S107). Then oxygen donor in the silicon wafer is eliminated by applying heat treatment (S108), followed by the cleaning and rinsing processes (S109) and polishing of the silicon wafers (S110). Last, the silicon wafers are cleaned with the first ultra-pure water, cleaned with the chemical solution prepared by using the second ultra-pure water and rinsed with the second ultra-pure water (S111) successively, thereby finishing the silicon wafer.

Now experimental results of the semiconductor wafer according to the Example will be described in comparison to experimental results of the prior art.

First, the first ultra-pure water having a relatively high TOC value treated by the ultraviolet ray sterilization method is prepared. The second ultra-pure water is also prepared by treating the first ultra-pure water by the ultraviolet ray oxidization method. The second ultra-pure water has a lower TOC value than that of the first ultra-pure water. The first ultra-pure water and the second ultra-pure water are introduced into a primary line. Then high purity ozone water is made by using an ozone generation apparatus based on electrolysis. Ozone concentration in the ozone water was measured.

The ozone water is stored in a cleaning bath. Concentration of ozone dissolved in the ozone water was measured in the cleaning bath.

Concentration of ozone was measured by ultraviolet ray absorption method. The period of time from the measurement of ozone concentration in the cleaning bath to the measurement of ozone concentration at the point of use is 30 seconds.

TABLE 1

| | TOC value (μg/liter) | Ozone concentration (μg/liter) | |
| --- | --- | --- | --- |
| | | Manufacturing apparatus | Point of use |
| UV oxidization | 0.3 | 25.3 | 6.2 |
| UV sterilization | 3.5 | 24.5 | 18.6 |

As will be apparent from Table 1, rate of ozone decay in the second ultra-pure water treated by the ultraviolet ray oxidization method was conspicuous in the cleaning bath (point of use). From this fact, it was found that sufficient effect of ozone cannot be achieved by treating the silicon wafer with ultra-pure water that has been treated by the ultraviolet ray oxidization method.

Then the silicon wafer is treated with ultra-pure water prepared by different treating method (ultraviolet ray sterilization method or ultraviolet ray oxidization method). Quantity of metallic impurities on the silicon wafer that has been treated was measured. The treatment was carried out by pickling the silicon wafer, treating it with ozone water and applying the ultra-pure water rinsing process.

TABLE 2

| | Treatment method | | | Concentration of metallic impurities | | | | | |
| --- | --- | --- | --- | --- | --- | --- | --- | --- | --- |
| | Ozone water treatment process | Chemical solution treatment | Rinsing | (E + 10 atoms/cm$^2$) | | | | | |
| | | | | Na | Al | Fe | Ni | Cu | Zn |
| Comparative Example 1 | UV sterilization | UV sterilization | UV sterilization | 0.08 | 0.13 | 0.04 | <0.01 | 0.01 | 0.02 |
| Comparative Example 2 | UV oxidization | UV oxidization | UV oxidization | 0.01 | 0.02 | 0.01 | <0.01 | <0.01 | 0.01 |
| Example | UV sterilization | UV oxidization | UV oxidization | 0.02 | 0.02 | <0.01 | <0.01 | <0.01 | 0.01 |

The experimental results show that, in the Example, more remarkable reduction of impurities, aluminum in particular, can be achieved compared to a case of using the ultra-pure water obtained by the ultraviolet ray sterilization method (Comparative Example 1) in all the cleaning and processes.

In the Example, substantially the same degree of cleanliness was achieved as in a case of using the ultra-pure water obtained by the ultraviolet ray oxidization method (Comparative Example 2) in all the cleaning and rinsing processes.

Accordingly, in the ozone water treatment process, the ultra-pure water that has been treated by the ultraviolet ray sterilization method and has a TOC value a little higher than that of the ultra-pure water treated by the ultraviolet my oxidization method is used. It was found that higher cleanliness of the silicon wafer can be achieved by treating with the ultra-pure water that has been treated by the ultraviolet ray oxidization method and has a lower TOC value, in the ultra-pure water rinsing process including the cleaning process and the rinsing process after the chemical treatment.

What is claimed is:

1. A semiconductor wafer treatment method comprising:
   an ozone water treatment process in which the semiconductor wafer is treated by using a first ultra-pure water that includes a predetermined total organic carbon content and includes ozone gas added thereto, the first ultra-pure water being treated by an ultraviolet ray sterilization method, and the first ultra-pure water including a total organic carbon content that is more than 1 μg/liter and less than 20 μg/liter;
   an ultra-pure water rinsing process in which the semiconductor wafer is treated by using a second ultra-pure water, the second ultra-pure water being treated by ultraviolet ray oxidization method, and the second ultra-pure water including a total organic carbon content that is 1 μg liter or less; and
   a chemical solution cleaning process in which the semiconductor wafer is cleaned by a chemical solution using the second ultra-pure water as diluting water, before executing the ultra-pure water rinsing process.

2. The semiconductor wafer treatment method according to claim 1, wherein the chemical solution cleaning process is carried out before the ozone water treatment process.

3. The semiconductor wafer treatment method according to claim 1, wherein the chemical solution cleaning process is carried out after the ozone water treatment process.

4. The semiconductor wafer treatment method according to claim 1, further comprising:
   a slicing step in which a single crystal ingot of silicon is sliced into a number of semiconductor wafers, wherein
   the ozone water treatment process, the ultra-pure water rinsing process, and the chemical solution cleaning process are performed after the slicing step, and particulate matter deposited during the slicing process is removed.

5. The semiconductor wafer treatment method according to claim 4, further comprising:
   a chamfering step; and
   a lapping step, wherein
   the chamfering step and the lapping step are successively performed after the particulate matter deposited during the slicing process is removed, and the ozone water treatment process, the ultra-pure water rinsing process, and the chemical solution cleaning process are performed after the lapping step.

6. The semiconductor wafer treatment method according to claim 5, further comprising:
   an etching step with a predetermined etching solution in which strains caused by slicing are relieved from the semiconductor wafers after the ozone water treatment process, the ultra-pure water rinsing process, and the chemical solution cleaning process, wherein
   the ozone water treatment process, the ultra-pure water rinsing process, and the chemical solution cleaning process are performed after the etching step, and the etching solution is rinsed off.

7. The semiconductor wafer treatment method according to claim 6, further comprising:
   a donor killing step in which a oxygen donor in the semiconductor wafers is eliminated by applying heat treatment after the etching solution is rinsed off, wherein
   the ozone water treatment process, the ultra-pure water rinsing process, and the chemical solution cleaning process are performed after the donor killing step.

8. The semiconductor wafer treatment method according to claim 7, further comprising:
   a polishing step in which the semiconductor wafers are polished after the ozone water treatment process, the ultra-pure water rinsing process, and the chemical solution cleaning process, wherein
   the ozone water treatment process, the ultra-pure water rinsing process, and the chemical solution process are performed after the polishing step.

* * * * *